(12) United States Patent
Kim et al.

(10) Patent No.: US 10,345,948 B2
(45) Date of Patent: Jul. 9, 2019

(54) ELECTRONIC DEVICE FOR DETERMINING VALID USER INPUT

(71) Applicant: Samsung Electronics Co., Ltd., Suwon-si, Gyeonggi-do (KR)

(72) Inventors: Shin Ho Kim, Yongin-si (KR); Cheol Ho Lee, Suwon-si (KR); Dae Woong Kim, Yongin-si (KR); Il Hyung Chung, Osan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 84 days.

(21) Appl. No.: 15/198,794

(22) Filed: Jun. 30, 2016

(65) Prior Publication Data

US 2017/0003809 A1 Jan. 5, 2017

(30) Foreign Application Priority Data

Jun. 30, 2015 (KR) .................... 10-2015-0093163

(51) Int. Cl.
*G06F 3/041* (2006.01)
*G06F 3/044* (2006.01)
*H03K 17/96* (2006.01)

(52) U.S. Cl.
CPC ............ *G06F 3/0416* (2013.01); *G06F 3/044* (2013.01); *H03K 17/9622* (2013.01);
(Continued)

(58) Field of Classification Search
USPC ..................................................... 345/174
See application file for complete search history.

(56) References Cited

U.S. PATENT DOCUMENTS 5,189,417 A * 2/1993 Caldwell ........... H03K 17/9622
                                                    341/26
8,125,441 B2 2/2012 Li
(Continued)

FOREIGN PATENT DOCUMENTS

KR   10-2008-0042294 A   5/2008
KR      10-1490705 B1    2/2015
(Continued)

OTHER PUBLICATIONS

6. Williams P A et al: "Design of Augmentative Input Interface Devices for Handicapped Children", Proceedings of the Annual Conference of the Engineering in Medicine and Biology Society. Philadelphia, Nov. 1-4, 1990; [Proceedings of the Annual Conference of the Engineering in Medicine and Biology Society], New York, IEEE, US, vol. 12 : 1990, Nov. 1, 1990 (Nov. 1, 1990), pp. 2301-2302, XP000239011.

*Primary Examiner* — Chineyere D Wills-Burns
(74) *Attorney, Agent, or Firm* — Jefferson IP Law, LLP

(57) ABSTRACT

An apparatus and method for determining a valid user input in an electronic device is provided. The electronic device generally includes a touch unit included in a touch input circuit, wherein the touch unit corresponds to a touch area, a signal generator configured to transmit a signal to a first signal line and a second signal line by generating the signal, a signal measuring device configured to measure a part of a modified signal based on the transmitted signal, and a signal determiner configured to determine whether a user input is provided to the touch area based on the measured signal. The first signal line connects the signal generator and the touch unit, and the second signal line extends from the signal generator and is parallel with the first signal line.

17 Claims, 7 Drawing Sheets

(52) U.S. Cl.
CPC .............. *G06F 2203/04102* (2013.01); *H03K 2217/960715* (2013.01); *H03K 2217/960745* (2013.01)

(56) References Cited

U.S. PATENT DOCUMENTS

| | | | |
|---|---|---|---|
| 8,537,107 B1 | 9/2013 | Li | |
| 8,766,947 B2 | 7/2014 | Cheng et al. | |
| 8,842,228 B2 | 9/2014 | Moon | |
| 8,902,172 B2 | 12/2014 | Peng et al. | |
| 9,141,228 B2 | 9/2015 | Akagi | |
| 2003/0210809 A1* | 11/2003 | Kim | G06K 9/0002 382/124 |
| 2006/0007181 A1* | 1/2006 | Jung | G06F 3/03543 345/173 |
| 2008/0136792 A1 | 6/2008 | Peng et al. | |
| 2008/0143671 A1 | 6/2008 | Li | |
| 2009/0095542 A1* | 4/2009 | Moon | G06F 3/044 178/18.06 |
| 2009/0225044 A1* | 9/2009 | Jeon | G06F 3/0418 345/173 |
| 2010/0212975 A1* | 8/2010 | Moon | G06F 3/0418 178/18.06 |
| 2010/0259284 A1 | 10/2010 | Winkens | |
| 2011/0227863 A1 | 9/2011 | Cheng et al. | |
| 2012/0068760 A1* | 3/2012 | Caldwell | G06F 3/0418 327/517 |
| 2012/0071149 A1* | 3/2012 | Bandyopadhyay | G06F 1/1643 455/418 |
| 2012/0182259 A1* | 7/2012 | Han | G06F 3/044 345/174 |
| 2013/0100043 A1* | 4/2013 | Kolbe | G06F 3/0488 345/173 |
| 2013/0249840 A1 | 9/2013 | Akagi | |
| 2013/0286301 A1 | 10/2013 | Moon | |
| 2014/0152327 A1 | 6/2014 | Erkens | |
| 2014/0192014 A1 | 7/2014 | Lee et al. | |
| 2014/0312962 A1 | 10/2014 | Kao | |
| 2015/0084916 A1* | 3/2015 | Han | G06F 3/044 345/174 |
| 2015/0144475 A1* | 5/2015 | Johnson | H03K 17/9622 200/600 |
| 2015/0212643 A1* | 7/2015 | Lee | G06F 3/0416 345/174 |
| 2016/0170511 A1* | 6/2016 | Dighde | G06F 3/041 345/173 |

FOREIGN PATENT DOCUMENTS

| | | |
|---|---|---|
| KR | 10-1496183 B1 | 2/2015 |
| KR | 10-1509354 B1 | 4/2015 |

\* cited by examiner

WHEN TOUCHING PAD

WHEN FPCB CAPACITANCE IS CHANGED

ELECTRONIC DEVICE FOR DETERMINING VALID USER INPUT

CROSS-REFERENCE TO RELATED APPLICATION(S)

This application claims the benefit under 35 U.S.C. § 119(a) of a Korean patent application filed on Jun. 30, 2015 in the Korean Intellectual Property Office and assigned Serial number 10-2015-0093163, the entire disclosure of which is hereby incorporated by reference.

TECHNICAL FIELD

The present disclosure relates to an electronic device for determining a valid user input. More particularly, the present disclosure relates to an electronic device with a touch screen or display, and a method of detecting a valid user input to the touch screen or display.

BACKGROUND

With the development of electronic technology, various electronic devices including a television (TV), a desktop, a notebook, a mobile phone, a Moving Picture Experts Group phase 1 or phase 2 (MPEG-1 or MPEG-2) audio layer 3 (MP3) player, and so on have emerged, and electronic devices having performed typically one-directional functions have gradually evolved to perform bi-directional functions based on interaction with users. To this end, various electronic devices have adopted various user interfaces receiving user inputs.

As user interfaces of typical computers, keyboards and mice have been used, and with the development of technology, touch panels have developed. Currently various electronic devices including smartphones are focused on mobility and therefore touch panels with reduced weight are being adopted.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an electronic device for determining a valid user input. However, technical issues of the present disclosure are not limited to those described above and other technical issues will be clearly understood by those skilled in the art from the following description.

In accordance with an aspect of the present disclosure, an electronic device is provided. The electronic device generally includes a touch unit (e.g., touch display), a signal generating unit (signal generator) configured to generate a signal and to transmit the signal to a first signal line and a second signal line, a signal measuring unit (signal measuring device) configured to measure at least a part of modified signal based on the transmitted signal, and a signal determining unit (signal determiner) configured to determine whether a user input is provided to the touch display based on the measured signal, wherein the first signal line connects the signal generator and the touch display, and the second signal line extends from the signal generator and is parallel with the first signal line.

Both terminals of the signal measuring device may be respectively connected to a signal line extending from a node on the first signal line in parallel with the signal generator and to a signal line extending from a node on the second signal line in parallel with the signal generator, a resistor may be disposed between the node on the first signal line and the signal generator, and another resistor may be disposed between the node on the second signal line and the signal generator.

The measured signal may represent a difference between a voltage value of the node on the first signal line and a voltage value of the node on the second signal line.

The signal determiner may determine, from a voltage value of the measured signal, whether the user input is provided.

The second signal line may not be connected to the touch display.

The first signal line and the second signal line may be wired on a flexible printed circuit board (FPCB), and the first signal line and the second signal line include capacitors corresponding to the FPCB.

The modified signal may be the signal modified based on charging and discharging operations.

The second signal line may extend from the signal generator to be grounded so as to abut on a node at which the first signal line and the touch display are connected.

The signal measuring device may include a first signal measuring device and a second signal measuring device, the first signal measuring device may be connected to a signal line extending from a node on the first signal line in parallel with the signal generator, the second signal measuring device may be connected to a signal line extending from a node on the second signal line in parallel with the signal generator, a resistor may be disposed between the node on the first signal line and the signal generator, and a resistor may be disposed between the node on the second signal line and the signal generator.

The signal determiner may determine whether the user input is received by comparing pulse widths of signals respectively measured by the first and second signal measuring devices.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1A:
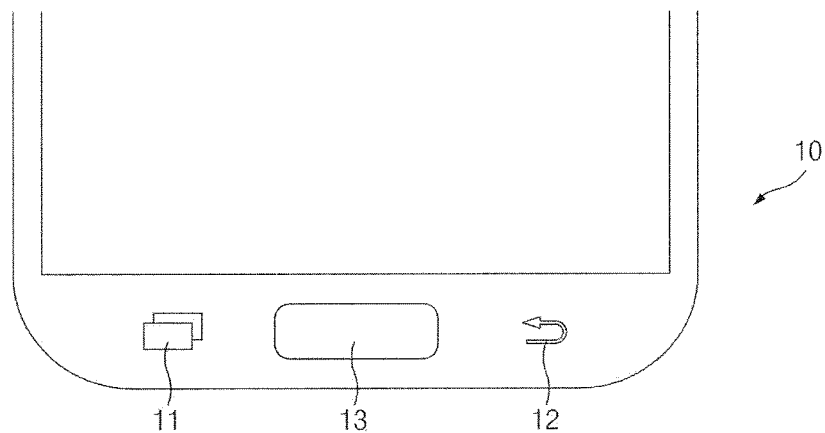
FIGS. 1A and 1B illustrate an electronic device and a touch input circuit coupled to at least a portion of the electronic device according to various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The term "include," "comprise," and "have", or "may include," or "may comprise" and "may have" used herein indicates disclosed functions, operations, or existence of elements but does not exclude other functions, operations or elements. Additionally, in various embodiments of the present disclosure, the term "include," "comprise," "including," or "comprising," specifies a property, a region, a fixed number, a process, an element and/or a component but does not exclude other properties, regions, fixed numbers, processes, elements and/or components.

In various embodiments of the present disclosure, expression "A or B" or "at least one of A and/or B" may include all possible combinations of items listed together. For instance, the expression "A or B", or "at least one of A and/or B" may indicate include A. B, or both A and B.

The terms such as "1st", "2nd", "first", "second", and the like used herein may refer to modifying various different elements of various embodiments of the present disclosure, but do not limit the elements. For instance, such expressions do not limit the order and/or importance of corresponding components. The expressions may be used to distinguish one element from another element. For instance, both "a first user device" and "a second user device" indicate a user device and indicate different user devices from each other. For example, a first component may be referred to as a second component and vice versa without departing from the scope of the present disclosure.

In this disclosure below, when one part (or element, device, etc.) is referred to as being "connected" to another part (or element, device, etc.), it should be understood that the former can be "directly connected" to the latter, or "connected" to the latter via an intervening part (or element, device, etc.). In contrast, when an element is referred to as being "directly connected" or "directly coupled" to another element, there are no intervening elements present.

Unless otherwise indicated herein, all the terms used herein, which include technical or scientific terms, may have the same meaning that is generally understood by a person skilled in the art. In general, the terms defined in the dictionary should be considered to have the same meaning as the contextual meaning of the related art, and, unless clearly defined herein, should not be understood abnormally or as having an excessively formal meaning.

An electronic device according to various embodiments of the present disclosure may include at least one of a smartphone, a tablet personal computer (PC), a mobile phone, a video telephone, an electronic book reader, a desktop PC, a laptop PC, a netbook computer, a workstation, a server, a personal digital assistant (PDA), a portable multimedia player (PMP), a Moving Picture Experts Group phase 1 or phase 2 (MPEG-1 or IMPEG-2) audio layer 3 (MP3) player, a mobile medical device, a camera, or a wearable device. The wearable device may include at least one of an accessory-type device (e.g., a watch, a ring, a bracelet, an anklet, a necklace, glasses, a contact lens, a head-mounted device (HMD)), a textile- or clothing-integrated-type device (e.g., an electronic apparel), a body-attached-type device (e.g., a skin pad or a tattoo), or a bio-implantable-type device (e.g., an implantable circuit)

In various embodiments of the present disclosure, an electronic device may be a home appliance. The smart home appliance may include at least one of, for example, a television (TV), a digital versatile disc (DVD) player, an audio, a refrigerator, an air conditioner, a cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ or PlayStation™), an electronic dictionary, an electronic key, a camcorder, or an electronic picture frame.

In other various embodiments of the present disclosure, an electronic device may include at least one of various medical devices (e.g., various portable medical measurement devices (e.g., a blood glucose measuring device, a heart rate measuring device, a blood pressure measuring device, a body temperature measuring device, or the like), a magnetic resonance angiography (MRA), a magnetic resonance imaging (MRI), a computed tomography (CT), a scanner, an ultrasonic device, or the like), a navigation device, a global navigation satellite system (GNSS), an event data recorder (EDR), a flight data recorder (FDR), a vehicle infotainment device, electronic equipment for vessels (e.g., a navigation system, a gyrocompass, or the like), avionics, a security device, a head unit for a vehicle, an industrial or home robot, an automated teller machine (ATM), a point of sales (POS) device of a store, or an Internet of things (IoT) device (e.g., a light bulb, various sensors, an electric or gas meter, a sprinkler, a fire alarm, a thermostat, a streetlamp, a toaster, exercise equipment, a hot water tank, a heater, a boiler, or the like).

According to various embodiments of the present disclosure, an electronic device may include at least one of a part of furniture or a building/structure, an electronic board, an electronic signature receiving device, a projector, or a measuring instrument (e.g., a water meter, an electricity meter, a gas meter, a wave meter, or the like). An electronic device may be one or more combinations of the above-mentioned devices. An electronic device according to various embodiments of the present disclosure may be a flexible device. An electronic device according to an embodiment of the present disclosure is not limited to the above-mentioned devices, and may include new electronic devices with the development of new technology.

Hereinafter, an electronic device according to various embodiments of the present disclosure will be described in more detail with reference to the accompanying drawings. The term "user" used herein may refer to a person who uses an electronic device or may refer to a device (e.g., an artificial intelligence electronic device) that uses an electronic device.

Hereinafter description will be provided by exemplifying a smartphone as an electronic device according to various embodiments of the present disclosure in the accompanying drawings.

FIG. 1A illustrates a front case of an electronic device 10 and a touch input circuit 100 coupled to a part of the front case of the electronic device 10 according to various embodiments of the present disclosure.

Referring to FIG. 1A, in a lower portion of a front case of the electronic device 10, there are a first touch region 11 operating through a touch input, a second touch region operating through a touch input, and a physical button 13 operating through a user input such as a click.

Figure 1B:
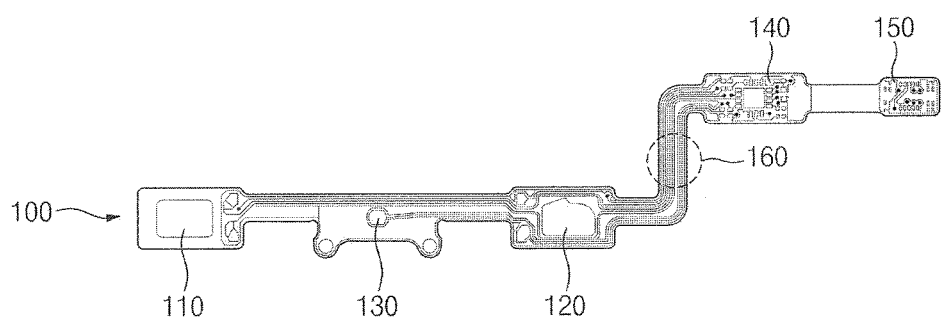

Referring to FIG. 1B, a touch input circuit 100 may be disposed under the front case of the electronic device 10. For example, the touch input circuit 100 may be located such that a first touch unit 110 is disposed under the first touch region 11, a second touch unit 120 is disposed under the second touch region 12, and a click unit 130 is disposed under the physical button 13.

The touch input circuit 100 may include the first touch unit 110, the second touch unit 120, the click unit 130, a touch integrated circuit (IC) 140, and a connector 150. The touch IC 140 may determine whether a touch input is provided on the first touch region 11 through the first touch unit 110. The touch IC 140 may determine whether a touch input is provided on the second touch region 12 through the second touch unit 120. In addition, the touch IC 140 may determine whether the physical button 13 is pressed through the click unit 130. An operation in which the touch IC 140 determines whether there is a touch input through the first touch unit 110 or the second touch unit 120 will be described in relation to FIGS. 2 and 3.

According to an embodiment of the present disclosure, the connector 150 may be connected to a printed circuit board (not illustrated) of the electronic device 10. Processors (not illustrated) of the touch IC 140 and the electronic device 10 may be electrically connected to each other and transmit/receive signals therebetween. For example, the touch IC 140 may transmit a determination result of whether there is a touch input to the processor.

The touch input circuit 100 may be realized with a flexible printed circuit board (FPCB). Accordingly, wires respectively connecting the first touch unit 110, the second touch unit 120, the click unit 130, the touch IC 140, the first touch unit 110 and the touch IC 140, the second touch unit 120 and the touch IC 140, the click unit 130 and the touch IC 140 may be included in the FPCB.

Previously, it was mentioned that the touch input circuit 100 (shown in FIG. 1B) may be stacked under the front case of the electronic device 10 (shown in FIG. 1A). Although a length of the touch input circuit 100 is illustrated to be longer than a width of the electronic device 10 in FIGS. 1A and 1B, the FPCB has a flexible material and may be curved at one region 160. Accordingly, even though the length of the touch input circuit 100 is longer than the width of the electronic device 10, the touch input circuit 100 may be stacked on the rear surface of the front case of the electronic device 10.

Figure 2:
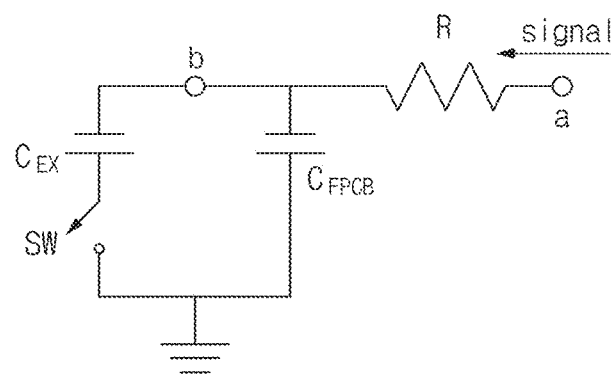
FIG. 2 illustrates a resistor-capacitor (RC) circuit for determining a touch input according to various embodiments of the present disclosure.

FIG. 2 illustrates a resistor-capacitor (RC) circuit for determining a touch input according to an embodiment of the present disclosure. A node a may be connected to another suitable circuit and may receive a signal from the circuit. Hereinafter, it is assumed that the node a receives a rectangular wave signal.

Referring to FIG. 2, capacitor $C_{EX}$ and a switch SW illustrated on the left side of a node b show effects of a capacitor and a switch by an operation activated outside the electronic device 10. For example, if a user's finger contacts the node b, a capacitor value generated by the user's finger may correspond to $C_{EX}$. In addition, an operation in which the user's finger contacts the node b may correspond to a state where the switch SW is on, and an operation in which the user's finger is separated from the node b may correspond to a state where the switch SW is off. In this case, the node b may correspond to the first touch unit 110 or the second touch unit 120 illustrated in FIG. 1B.

Referring to FIG. 2, capacitor $C_{FPCB}$ illustrated on the right side of the node b may represent a capacitor component existing on the FPCB on which the first touch unit 110 or the second touch unit 120 is arrayed. The capacitor component may be an independent capacitor element, or it may be a capacitor component generated from a wiring structure. According to an embodiment, $C_{FPCB}$ may be a capacitor included in the first touch unit 110 or the second touch unit 120.

Figure 3:
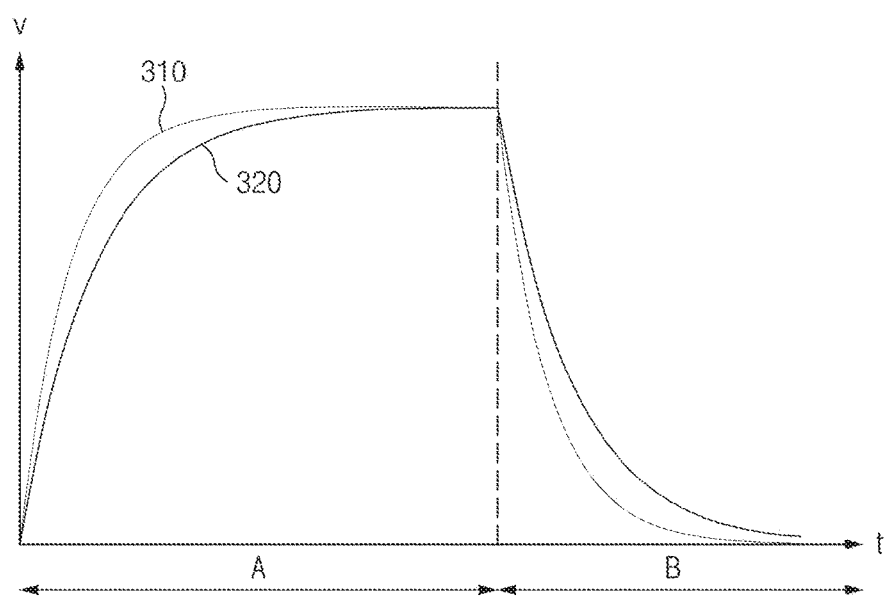
FIG. 3 is a graph for comparing a signal in a case where there is a touch input with a signal with another case where there is no touch input in the RC circuit illustrated in FIG. 2 according to various embodiments of the present disclosure.

FIG. 3 is a graph for comparing a signal in a case where there is a touch input with a signal in a case where there is no touch input in the RC circuit illustrated in FIG. 2 according to various embodiments of the present disclosure. A graph 310 may be a graph in a case where there is no touch input, and a graph 320 may be a graph in a case where there is a touch input.

If there is a touch input, the user's finger or an electronic pen (e.g. a stylus) is a $C_{EX}$ and may be connected to $C_{FPCB}$ of a typical $RC_{FPCB}$ circuit in parallel. If the capacitor is connected in parallel, a capacitance value of a synthetic capacitor $C_{EQ}$ becomes a sum of each capacitance value of each capacitor. In other words, $C_{EQ}$ may correspond to a sum of $C_{EX}$ and $C_{FCB}$. Accordingly, as the $C_{EX}$ is added, a capacitance value of an $RC_{EQ}$ circuit becomes greater than that of an $RC_{FPCB}$ circuit before $C_{EX}$ is added.

Referring to FIG. 3, the graphs 310 and 320 show operations that capacitors are discharged for time B, after each of $C_{FPCB}$ and $C_{EQ}$ is charged. Comparing graphs 310 and 320 with each other, for a time taken to charge each capacitor to a certain voltage (a prescribed ratio of a maximum charge voltage), it may be seen that a circuit of graph 320 takes longer than a circuit of graph 310. The charge time for each capacitor is related to a time constant of an RC circuit. At this point, the time constant of the RC circuit is a multiplication of values of R and C. In other words, the time constant of the graph 310 becomes a multiplication of R and $C_{FPCB}$ and the time constant of the graph 320 becomes a multiplication of R and $C_{EQ}$.

It may be seen that as a C value of an RC circuit is larger, a time taken to charge the capacitor becomes longer, and a charge time for a case where there is a touch input is longer than that for a case where there is not a touch input. The touch IC 140 may determine, from a charge time of the capacitor, whether there is a touch input.

In addition, a case where a charged C of the RC circuit is discharged may be similar to the operation that C is charged. For example, referring to the graphs 310 and 320, it may be seen that a discharge speed in a case where the touch input does not occur is faster than that in a case where the touch input occurs.

Besides a case where $C_{EX}$ is generated from a user's touch (via the user's finger or by a stylus), even in a case where $C_{EX}$ is generated due to the electronic device being pressed, the charge speed and discharge speed may be changed. In this case, the touch IC 140 may wrongly determine that a touch input was created by a user.

Figure 4:
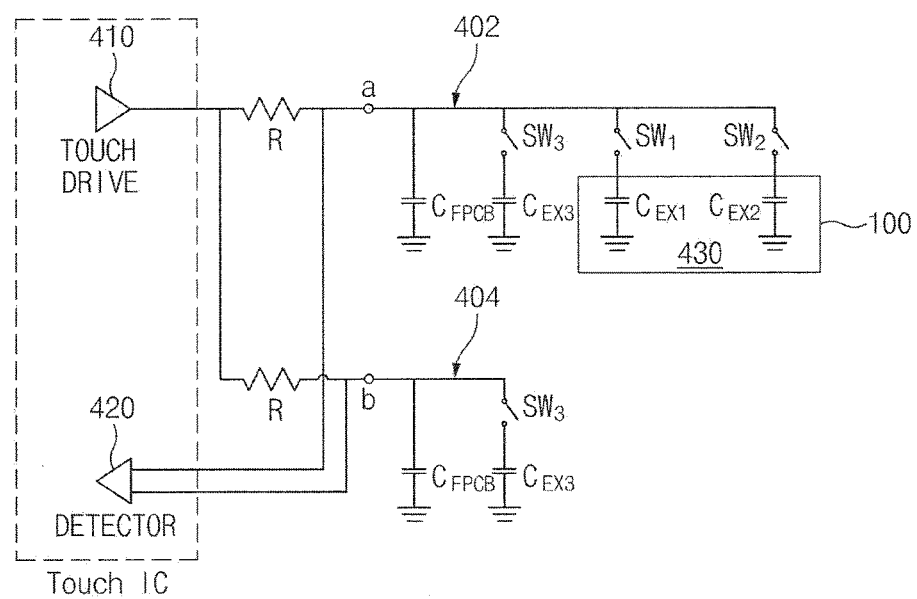
FIG. 4 illustrates a touch input circuit of an electronic device according to various embodiments of the present disclosure.

FIG. 4 illustrates a touch input circuit of an electronic device according to various embodiments of the present disclosure. A signal generating unit (e.g. a touch drive) 410 may generate a rectangular wave signal and provide the generated rectangular signal to the outside.

Referring to FIG. 4, each of a first signal line 402 and a second signal line 404 may be connected in parallel with the signal generating unit 410. According to an embodiment, the first signal line 402 or the second signal line 404 may extend to one region 430 of the touch input circuit. For example, while the first signal line 402 is connected to the one region 430 of the touch input circuit 100, the second signal line 404 may not be connected to the one region 430 of the touch input circuit. The one region 430 of the touch input circuit may correspond to the first touch unit 110, the second touch unit 120, and the click unit 130 of FIG. 1B.

The rectangular wave signal generated from the signal generating unit 410 may be transmitted to $C_{FPCB}$ extending from the first signal line 402 via a resistor R on the first signal line 402. As described above, $C_{FPCB}$ may correspond to a capacitor component generated by the capacitor element and/or a wiring structure and so on in the touch input circuit 100. In addition, if one or more of first to third switches $SW_1$, $SW_2$, and $SW_3$ are in a short-circuited state, the rectangular wave signal may be transmitted to a capacitor to which a corresponding switch is on among $C_{EX1}$ to $C_{EX3}$.

According to an embodiment, CEX1 and CEX2 may be capacitors induced by a user's finger. For example, if a touch input using the user's finger occurs for the first touch unit (e.g. the first touch unit 110 of FIG. 1) corresponding to the one region 430 of the touch input circuit, a capacitor component of CEX1 may be generated. In addition, CEX2 may be generated when there is a touch input using the user's finger for the second touch unit (e.g. the second touch unit 120 of FIG. 1B). In addition, CEX3 may be a capacitor generated, when a force is applied from the outside and an appearance of the electronic device 10 or an interval between elements is changed.

The rectangular wave signal generated from the signal generating unit 410 may be transmitted to $C_{FPCB}$ extending from the second signal line 404 via the resistor R. In addition, if the third switch $SW_3$ is on, the rectangular wave signal may be transmitted to $C_{EX3}$ extending from the second signal line 404, $C_{FPCB}$ and $C_{EX3}$ extending from the first signal line 402 may be the same capacitors as $C_{FPCB}$ and $C_{EX3}$ extending from the second signal line 404. For example, the first signal line 402 and the second signal line 404 may abut on each other to share $C_{FPCB}$ and $C_{EX3}$.

The resistor R and the capacitors $C_{FPCB}$, $C_{EX1}$, $C_{EX1}$, and $C_{EX3}$ connected to the first signal line 402, which are viewed from the signal generating unit 410, may be represented as an $RC_{EQ}$ circuit. In addition, the resistor R and the capacitors $C_{FPCB}$ and $C_{EX3}$ connected to the second signal line 404, which are viewed from the signal generating unit 410, may be represented as an $RC_{EQ}$ circuit.

Referring to the first signal line 402, a signal line extends from node a on the first signal line 402 to the signal measuring unit 420 in parallel with the signal generating unit 410. In addition, referring to the second signal line 404, a signal line extends from node b on the second signal line 404 to the signal measuring unit 420 in parallel with the signal generating unit 410. According to an embodiment, the signal line extending from node a may be connected to a first polarity (e.g. a positive polarity) of the signal measuring unit 420, and the signal line extending from node b may be connected to a second polarity (e.g. a negative polarity) of the signal measuring unit 420. Accordingly, the signal measuring unit 420 may measure a voltage difference between node a and node b.

According to an embodiment, the signal measuring unit 420 may independently measure the voltages of node a and node b. However, in relation to FIG. 4, a description will be provided such that the signal measuring unit 420 measures the voltage difference between node a and node b. In addition, the measured voltage difference between node a and node b will be described with reference to FIGS. 5A and 5B.

Figure 5A:
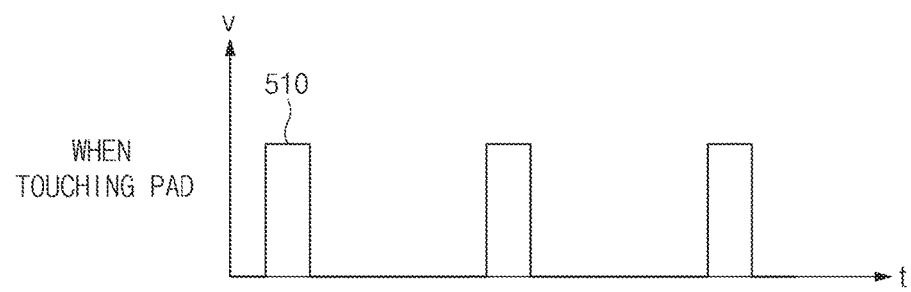
FIGS. 5A and 5B are graphs illustrating signals measured for a valid user input and for an invalid user input in by the touch input circuit of FIG. 4 according to various embodiments of the present disclosure.
Figure 5B:
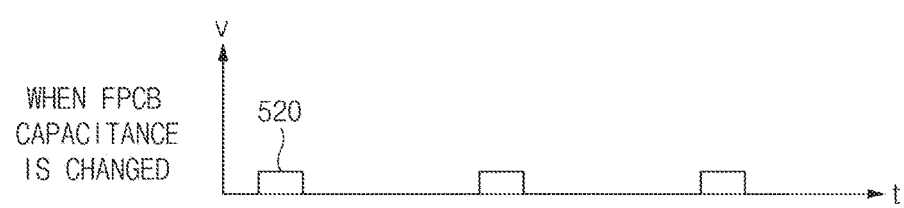

FIGS. 5A and 5B are graphs illustrating signals measured for a valid user input and for an invalid user input in the signal measuring unit illustrated in FIG. 4 according to various embodiments of the present disclosure.

FIG. 5A is a graph illustrating a voltage difference between node a and node b in a case where $C_{EX1}$ is connected by a user's touch input. If $C_{EX1}$ is connected by the user's touch input, an $RC_{EQ}$ circuit corresponding to the first signal line 402 may become $R(C_{FPCB}//C_{EX1})$ and an $RC_{EQ}$ circuit corresponding to the second line 404 may become the $RC_{FPCB}$ circuit. Accordingly, a value of $C_{EQ}$ corresponding to the first signal line 402 and a value of $C_{EQ}$ corresponding to the second signal line 404 become different. According to the voltage dividing principle, comparing two $RC_{EQ}$ circuits in which different $C_{EQ}$s are connected to an identical R, different voltages may be developed across the capacitors. Accordingly, there occurs a meaningful voltage difference between node a and node b. In a case where $C_{EX2}$ is connected to a circuit by a user's touch input (i.e., a case where a $C_{EX2}$ component is generated) may be the same.

According to an embodiment, the R value or the capacitance value of $C_{FPCB}$ may be determined in order that a meaningful voltage difference 510 may be generated.

FIG. 5B is a graph illustrating a voltage difference between node a and node b in a case where $C_{EX3}$ is connected by the electronic device being pressed. If $C_{EX3}$ is connected by the electronic device being pressed, the $RC_{EQ}$ circuit corresponding to the first signal line 402 may become an $R(C_{FPCB}//C_{EX3})$ circuit and the $RC_{EQ}$ circuit corresponding to the second line 404 may also become the R ($C_{FPCB}//C_{EX3}$) circuit. Accordingly, since the $C_{EQ}$ value corresponding to the first signal line 402 and the $C_{EQ}$ value corresponding to the second signal line 404 are substantially the same, a meaningless voltage difference 520 may be generated between node a and node b.

The operation for measuring whether the voltage difference 510 or 520 measured by the signal measuring unit 420 is meaningful or meaningless may be performed in the signal determining unit. The signal determining unit may correspond to the touch IC 140 of FIG. 1B. Alternatively, the signal determining unit may be a module included in a touch IC, and the signal generating unit 410 and the signal measuring unit 420 may also be a module included in the touch IC.

Although being illustrated like a pulse of a rectangular wave signal, the voltage differences 510 and 520 of FIGS. 5A and 5B may also appear as a type like the graph 310 or 320 of FIG. 3.

Figure 6:
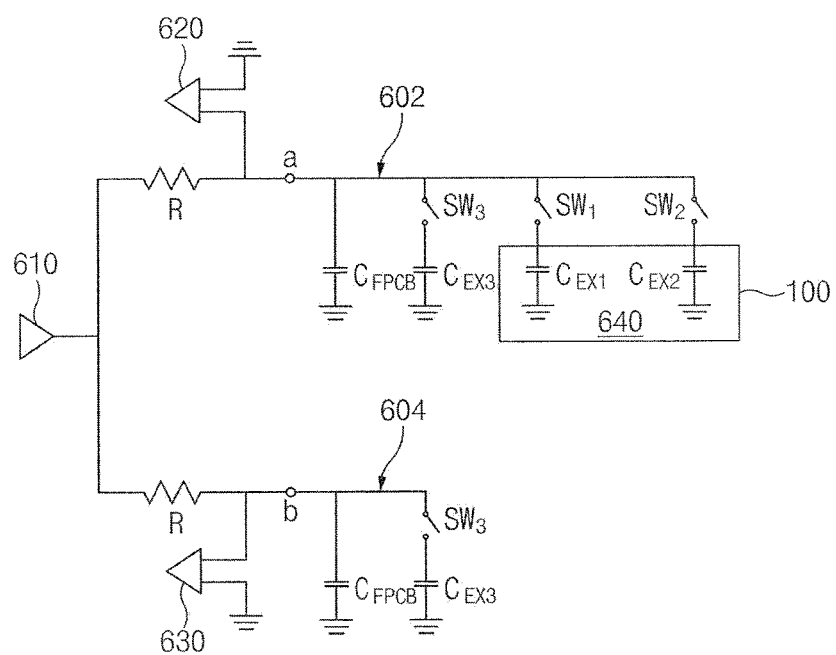
FIG. 6 illustrates a touch input circuit of an electronic device according to other various embodiments of the present disclosure.

FIG. 6 illustrates a touch input circuit of an electronic device according to another embodiment of the present disclosure. In relation to FIG. 6, descriptions identical, similar, or corresponding to those in relation to FIG. 4 may be omitted.

A signal generating unit (e.g. a touch drive) 610 may generate a signal, for example, a rectangular wave signal and may provide the generated rectangular wave signal outside of the signal generating unit 610. Referring to FIG. 6, each of a first signal line 602 and a second signal line 604 may be connected in parallel with the signal generating unit 610. In an embodiment, while the first signal line 602 is connected to one region 640 of the touch input circuit 100, the second signal line 604 may not be connected to the one region 640 of the touch input circuit. The one region 640 of the touch input circuit may correspond to the first touch unit 110, the second touch unit 120, and the click unit 130 of FIG. 1B.

Referring to the first signal line 602, the rectangular wave signal generated from the signal generating unit 610 may be transmitted to $C_{FPCB}$ extending from the first signal line 602 via a resistor R on the first signal line 602. As described above, $C_{FPCB}$ may correspond to a capacitor component generated by a capacitor element and/or a wiring structure and so on in the touch input circuit 100. In addition, if one or more of the first to third switches $SW_1$, $SW_2$, and $SW_3$ are on, the rectangular wave signal may be transmitted to a capacitor to which a corresponding switch is on among $C_{EX1}$ to $C_{EX3}$ extending from the first signal line 602.

The rectangular wave signal generated from the signal generating unit 610 may be transmitted via a resistor R to $C_{FPCB}$ extending from the second signal line 604. In addition, if the third switch $SW_3$ is on, the rectangular wave signal may be transmitted to $C_{EX3}$ extending from the second signal line 604. $C_{FPCB}$ and $C_{EX3}$ extending from the first signal line 602 may be the same as $C_{FPCB}$ and $C_{EX3}$ extending from the second signal lint 604. For example, the first signal ling 602 and the second signal line 604 may abut on each other to share $C_{FPCB}$ and $C_{EX3}$.

The resistor R and the capacitors $C_{FPCB}$, $C_{EX1}$, $C_{EX1}$, and $C_{EX3}$ connected to the first signal line 602, which are viewed from the signal generating unit 610, may be represented as an $RC_{EQ}$ circuit. In addition, the resistor R and the capacitors $C_{FPCB}$ and $C_{EX1}$ connected to the second signal line 604, which are viewed from the signal generating unit 610, may be represented as an $RC_{EQ}$ circuit.

Referring to the first signal line 602, a signal line extends from node a on the first signal line 602 to the signal measuring unit 620 in parallel with the signal generating unit 610. In addition, referring to the second signal line 604, a signal line extends from node b on the second signal line 604 to the signal measuring unit 630 in parallel with the signal generating unit 610. According to an embodiment, the first signal measuring unit 620 and the second signal measuring unit 630 respectively measure voltages of node a and node b according to a flow of time. Although FIG. 6 illustrates the first and second signal measuring units 620 and 630 as independent components, in an embodiment, the first and second signal measuring units 620 and 630 may be realized as one signal measuring unit.

The measured voltage difference between node a and node b will be described with reference to FIGS. 7A and 7B.

Figure 7A:
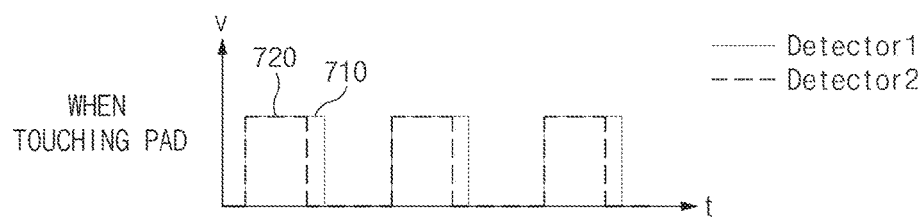
FIGS. 7A and 7B are graphs illustrating signals measured for a valid user input and for an invalid user input by the touch input circuit of FIG. 6 according to various embodiments of the present disclosure.
Figure 7B:
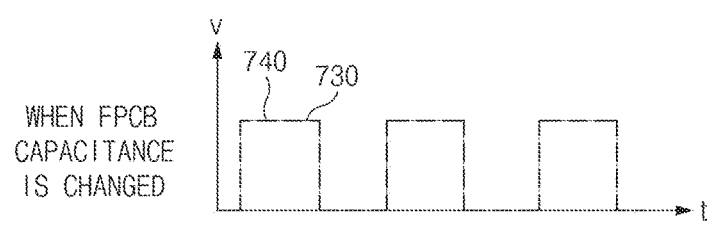

FIGS. 7A and 7B are graphs illustrating signals respectively measured for a valid user input and for an invalid user input in the signal measuring units illustrated in FIG. 6 according to another embodiment of the present disclosure.

FIG. 7A is a graph illustrating voltages at node a and node b in a case where $C_{EX1}$ is connected by a user's touch input. A graph 710 is a voltage of node a measured by the first signal measuring unit 620, and a graph 720 is a voltage of node b measured by the second signal measuring unit 630. If $C_{EX1}$ is connected by the user's touch input, an $RC_{EQ}$ circuit corresponding to the first signal line 602 may become an $R(C_{FPCB}//C_{EX1})$ circuit and an $RC_{EQ}$ circuit corresponding to the second line 604 may become an $RC_{FPCB}$ circuit. Accordingly, a time constant of the $RC_{EQ}$ circuit corresponding to the first signal line 602 and a time constant of the $RC_{EQ}$ circuit corresponding to the second signal line 604 become different. As described in relation to FIG. 3, pulse widths of voltages of node a and node b may be different due to a time constant difference. The case where $C_{EX2}$ is connected by a user's touch input may be the same.

FIG. 7B is a graph illustrating a voltage difference between node a and node b in a case where $C_{EX3}$ is connected by the electronic device being pressed. A graph 730 is a voltage of node a measured by the first signal measuring unit 620, and a graph 740 is a voltage of node b measured by the second signal measuring unit 630. If $C_{EX3}$ is connected by the electronic device being pressed, the $RC_{EQ}$ circuit corresponding to the first signal line 602 may become an $R(C_{FPCB}//C_{EX3})$ circuit and the $RC_{EQ}$ circuit corresponding to the second line 604 may also become the $R(C_{FPCB}//C_{EX3})$ circuit. Accordingly, since a $C_{EQ}$ value corresponding to the first signal line 602 and a $C_{EQ}$ value corresponding to the second signal line 604 are substantially the same, a time constant of the $RC_{EQ}$ circuit corresponding to the first signal line 602 and a time constant of the $RC_{EQ}$ circuit corresponding to the second signal line 604 may be the same.

Accordingly, a meaningful voltage difference may be generated between node a and node b. Although FIG. 7B illustrates graphs 730 and 740 identically, according to an embodiment, there is a minute difference between the graphs 730 and 740, which may be determined to be substantially the same.

An operation for determining a valid user input and an invalid user input from a voltage value measured from the first and second signal measuring units 620 and 630 may be performed in the signal determining unit. The signal determining unit may correspond to the touch IC 140 of FIG. 1B. Alternatively, the signal determining unit may be a module included in a touch IC, and the first and second signal measuring units 620 and 630 may also be modules included in the touch IC.

Although being illustrated like a pulse of a rectangular wave signal, the voltage differences 710 and 720 of FIG. 7A may appear like the type of the graphs 310 or 320 of FIG. 3.

A module or a program module according to various embodiments of the present disclosure may include at least one of the above-mentioned elements, or some elements may be omitted or other additional elements may be added. Operations performed by the module, the program module or other elements according to various embodiments of the present disclosure may be performed in a sequential, parallel, iterative or heuristic way. Furthermore, some operations may be performed in another order or may be omitted, or other operations may be added.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
a cover glass;
a display exposed through the cover glass;
a bezel surrounding the display when viewed from above the cover glass;
a touch circuit disposed under at least a portion of the bezel and configured to receive a user input through the bezel;
a first signal line electrically connected to the touch circuit;
a second signal line abutted on the first signal line to share a capacitor component; and
a touch integrated circuit (IC) electrically connected to the first signal line and the second signal line,
wherein the touch IC is configured to:
generate a signal and transmit the signal to the first signal line and the second signal line,
measure a first signal and a second signal through the first signal line and the second signal line, respectively, in response to the transmission of the signal, and
if a difference between the first signal and the second signal exists, determine that the received user input is valid or invalid,
wherein the received user input is determined to be valid when a width of the first signal is larger than a width of the second signal, and
wherein the received user input is determined to be invalid when the width of the first signal is equal to the width of the second signal.

2. The electronic device of claim 1, wherein both terminals of a signal measuring device are respectively connected to a signal line extending from a node on the first signal line in parallel with a signal generator and to a signal line extending from a node on the second signal line in parallel with the signal generator,
wherein a resistor is disposed between the node on the first signal line and the signal generator, and
wherein another resistor is disposed between the node on the second signal line and the signal generator.

3. The electronic device of claim 2, wherein the measured signal represents a difference between a voltage signal of the node on the first signal line and a voltage signal of the node on the second signal line.

4. The electronic device of claim 2, wherein a signal determiner determines, the measured signal, whether the user input is provided.

5. The electronic device of claim 1, wherein the second signal line is not connected to the touch circuit.

6. The electronic device of claim 5,
wherein the first signal line and the second signal line are wired on a flexible printed circuit board (FPCB), and
wherein the first signal line and the second signal line comprise capacitors corresponding to the FPCB.

7. The electronic device of claim 5, wherein the second signal line extends from the touch IC to be grounded so as to abut on a node at which the first signal line and the touch circuit are connected.

8. The electronic device of claim 1, wherein the touch IC is further configured to:
measure a third signal for discharging the first line to a second voltage and a fourth signal for discharging the second line to the second voltage through the first signal line and the second signal line, respectively; and
based on a difference between the third signal and the fourth signal determine that the received user input is valid or invalid,
wherein the received user input is determined to be valid when a width of the third signal is larger than a width of the fourth signal, and
wherein the received user input is determined to be invalid when the width of the third signal is equal to the width of the fourth signal.

9. The electronic device of claim 1,
wherein the touch IC comprises a first signal measuring device and a second signal measuring device,
wherein the first signal measuring device is connected in parallel with the first signal line, and extends from a node on the first signal line, and
wherein the second signal measuring device is connected in parallel with the second signal line, and extends from a node on the second signal line.

10. A method for determining whether a user input is valid or not in an electronic device, the method comprising:
receiving the user input through a touch circuit;
generating a signal and transmitting the signal to a first signal line and a second signal line which are abutting each other to share a capacitor component;
measuring a first signal and a second signal through the first signal line and the second signal line, respectively, in response to the transmission of the signal; and
if a difference between the first signal and the second signal exists, determining that the received user input is valid or invalid,
wherein the received user input is determined to be valid when a width of the first signal is larger than a width of the second signal, and
wherein the received user input is determined to be invalid when the width of the first signal is equal to the width of the second signal.

11. The method of claim 10,
wherein the first signal line connects a touch IC and the touch circuit, and
wherein the second signal line extends from the touch IC and is in parallel with the first signal line.

12. The method of claim 11,
wherein the touch IC comprises a first signal measuring device and a second signal measuring device,
wherein the first signal measuring device is connected in parallel with the first signal line, and extends from a node on the first signal line, and
wherein the second signal measuring device is connected in parallel with the second signal line, and extends from a node on the second signal line.

13. The method of claim 10, further comprising: providing a signal measuring device with both terminals that are respectively connected to a signal line extending from a node on the first signal line in parallel with a signal generator and to a signal line extending from a node on the second signal line in parallel with the signal generator, wherein a resistor is disposed between the node on the first signal line and the signal generator, and wherein another resistor is disposed between the node on the second signal line and the signal generator.

14. The method of claim 13, wherein the measured signal represents a difference between a voltage signal of a node on the first signal line and a voltage signal of a node on the second signal line.

15. The method of claim 13, further comprising: determining the measured signal, whether the user input is provided.

16. The method of claim 10, wherein the second signal line is not connected to the touch circuit.

17. A non-transitory computer-readable storage medium storing instructions that, when executed, cause at least one processor to perform the method of claim 10.

* * * * *